(12) United States Patent
Kondo (10) Patent No.: US 9,774,950 B2
(45) Date of Patent: Sep. 26, 2017

(54) MUSIC REPRODUCING DEVICE

(71) Applicant: Onkyo Corporation, Osaka (JP)

(72) Inventor: Yusuke Kondo, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 15/230,555

(22) Filed: Aug. 8, 2016

(65) Prior Publication Data

US 2017/0055073 A1    Feb. 23, 2017

(30) Foreign Application Priority Data

Aug. 18, 2015   (JP) ................. 2015-160829

(51) Int. Cl.
*H04R 3/00* (2006.01)
*H04R 5/04* (2006.01)
(Continued)

(52) U.S. Cl.
CPC ............. *H04R 3/00* (2013.01); *H03F 1/02* (2013.01); *H03F 3/181* (2013.01); *H04R 1/1041* (2013.01); *H04R 5/04* (2013.01); *H03F 2200/03* (2013.01); *H03F 2200/372* (2013.01); *H04R 2430/01* (2013.01)

(58) Field of Classification Search
CPC combination set(s) only.
See application file for complete search history.

(56) References Cited

U.S. PATENT DOCUMENTS 3,699,465 A * 10/1972 Pranke ................. H03F 3/26
330/122

4,881,123 A * 11/1989 Chapple ............... H04R 27/00
381/104
(Continued)

FOREIGN PATENT DOCUMENTS

JP    H05-075362 A    3/1993
JP    H05-095238 A    4/1993
(Continued)

OTHER PUBLICATIONS

Shigeru Kizuka, Use of PCM1704, Definitive edition of DAC?, making of 96kHz/24bit Super Hi-Fi DA converter (2), Radio Technique, Iar Publishing Corporation, Jul. 1, 2001, 55th volume, No. 7, 25-33 pages.
(Continued)

*Primary Examiner* — Assad Mohammed
(74) *Attorney, Agent, or Firm* — Renner Otto Boisselle & Sklar, LLP (57) ABSTRACT

To be easy for a user to judge difference of sound quality of an audio signal that is output in a balanced mode and sound quality of the audio signal that is output in an active control ground mode.
A DAP 1 has a balanced mode and an ACG mode. In the balanced mode, an analog audio data is amplified by an amplifier 8, a negative-phase data of the analog audio data is amplified by an amplifier 9, and the amplified analog audio data and the amplified negative-phase data are mixed so as to be output. In the ACG mode, the analog audio data is amplified by the amplifier 8 and ground is maintained by the amplifier 9. The CPU 2 decreases volume of the analog audio data that is output in the balanced mode compared with volume of the analog audio data that is output in the ACG mode.

5 Claims, 12 Drawing Sheets

(51) Int. Cl.
H03F 1/02 (2006.01)
H03F 3/181 (2006.01)
H04R 1/10 (2006.01)

(56) References Cited

U.S. PATENT DOCUMENTS

| | | | |
|---|---|---|---|
| 8,581,661 B2 * | 11/2013 | Friend | H03F 3/187 330/254 |
| 2004/0116162 A1 | 6/2004 | Matsushima et al. | |
| 2007/0241813 A1 * | 10/2007 | Freeke | H03F 3/45367 330/117 |
| 2008/0024213 A1 | 1/2008 | Magrath | |
| 2012/0201400 A1 * | 8/2012 | Ayres | H03G 3/301 381/107 |
| 2013/0195289 A1 * | 8/2013 | Yamauchi | H03F 1/523 381/120 |

FOREIGN PATENT DOCUMENTS

| | | |
|---|---|---|
| JP | H06-188842 A | 7/1994 |
| JP | 2004-128599 A | 4/2004 |
| JP | 2009-081641 | 4/2009 |
| JP | 2013-005291 | 1/2013 |

OTHER PUBLICATIONS

Decision to Grant for corresponding Japanese Application No. 2015-160829, dated Dec. 27, 2016, and English translation.

\* cited by examiner

MUSIC REPRODUCING DEVICE

BACKGROUND OF THE INVENTION

1. Field of the Invention

The present invention relates to a music reproducing device that outputs an audio signal to a headphone.

2. Description of the Related Art

In a headphone output of a music reproducing device that outputs an audio signal to a headphone, there are systems that are called unbalanced output and balanced output (for example, see JP 2013-005291 A). In an unbalanced system, a three-pole terminal with a diameter of 3.5 mm is used, and the audio signal is transmitted by two kinds of "hot" and "cold". Meanwhile, in a balanced system, a four-pole terminal with a diameter of 2.5 mm is used, and a signal is transmitted by three kinds of "ground", "hot" and "cold". "Cold" is opposite phase of "hot". In case that external noise occurs, noise of the same phase is superposed on both "cold" and "hot". By inverting phase of "cold" and mixing inverted "cold" signal with "hot" signal, external noise is cancelled and amplitude of audio signal becomes twice. For this reason, the balanced system is strong against noise and sound quality is good in the balanced system.

Figure 11:
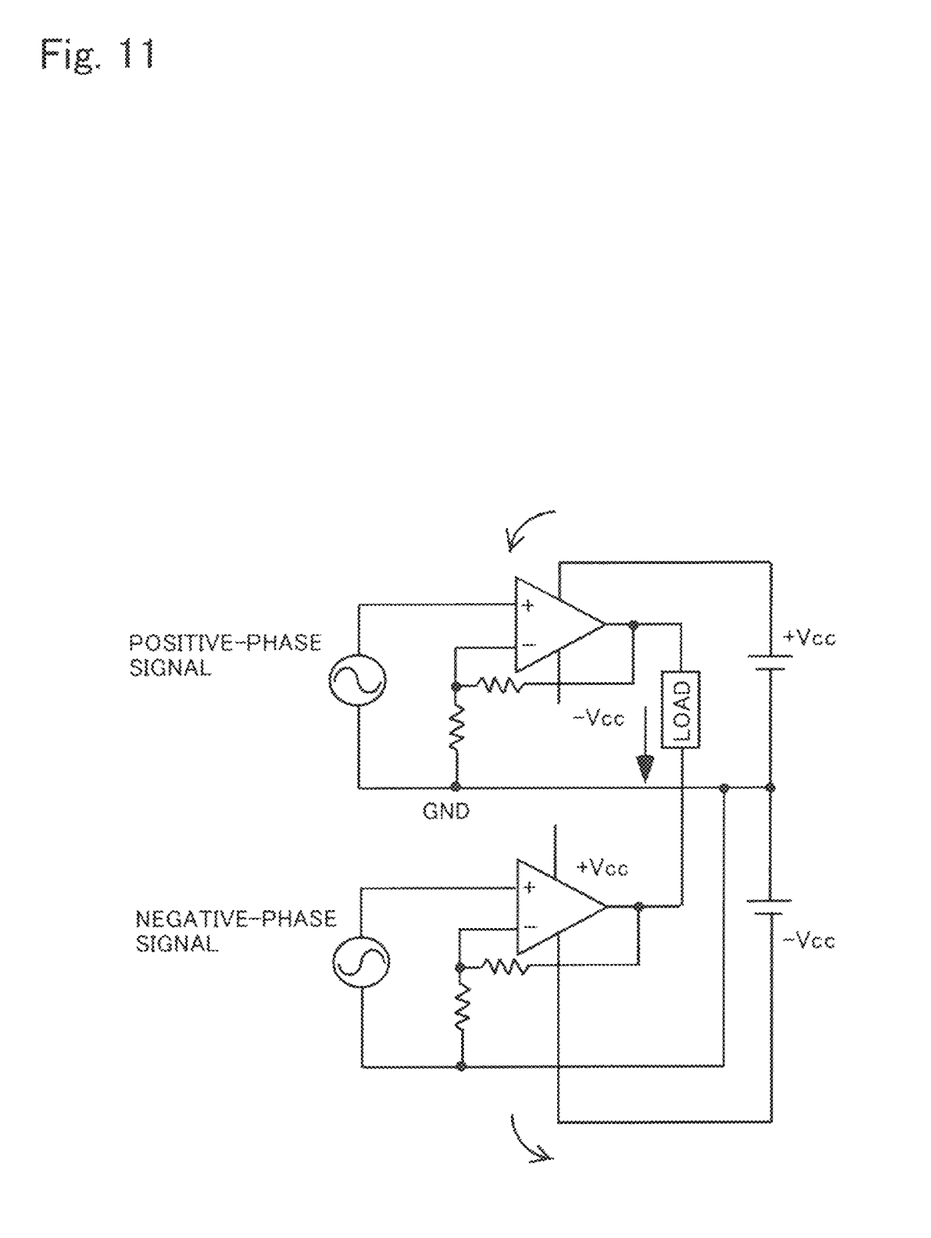
FIG. 11 is a diagram for describing the balanced mode.

FIG. 11 is a diagram illustrating amplifiers that amplify the audio signal in the balanced system. A positive-phase signal is input to one amplifier. The one amplifier amplifies the positive-phase signal. A negative-phase signal is input to the other amplifier. The other amplifier amplifies the negative-phase signal. The amplified positive-phase signal and negative phase signal are mixed. Hereinafter, the balanced system is called the balanced mode.

Figure 12:
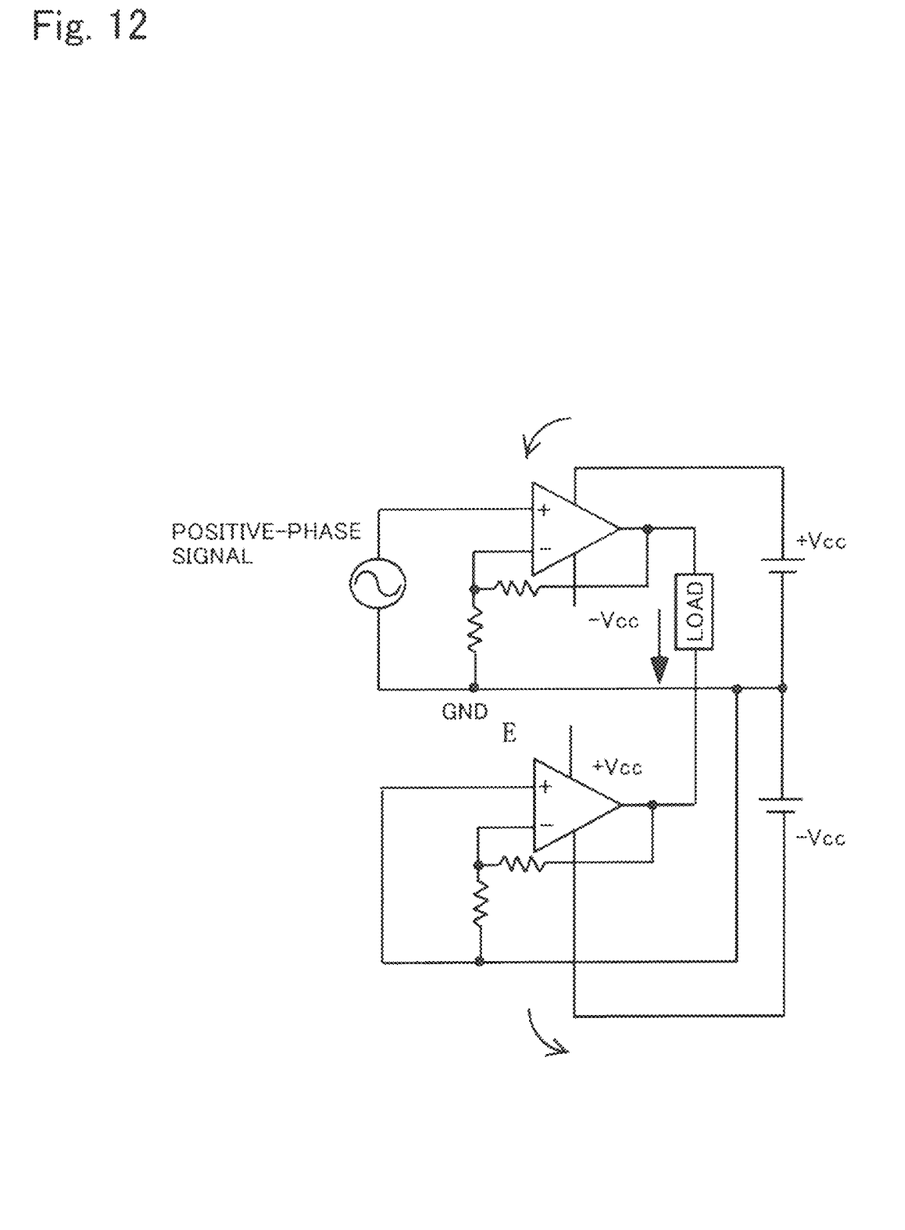
FIG. 12 is a diagram for describing an active control ground mode.

FIG. 12 is a diagram illustrating the other system that amplifies the audio signal using two amplifiers. An audio signal is input into one amplifier. The one amplifier amplifies the audio signal. The other amplifier is connected to ground. For this reason, output of the other amplifier is maintained to 0V (ground). In this system, ground is stabilized by the other amplifier. and noise can be reduced without burden on the amplifier. Hereinafter, the other system illustrated in FIG. 12 is called active control ground (hereinafter, referred as to "ACG") mode.

In the music reproducing device, a user can select either mode of preference by enabling to switch the balanced mode and the ACG mode. However, amplitude of the audio signal that is output in the balanced mode becomes twice compared with amplitude of the audio signal that is output in the ACG mode. For this reason, volume of the audio signal that is output in the balanced mode also becomes twice compared with volume of the audio signal that is output in the ACG mode. In both mode, volume is different each other and it is difficult for the user to judge difference of sound quality because sound quality depends on volume.

SUMMARY OF THE INVENTION

An objective of the present invention is to be easy for a user to judge difference of sound quality of an audio signal that is output in a balanced mode and sound quality of the audio signal that is output in an active control ground mode.

A music reproducing device having a balanced mode and an active control ground mode comprising: a first amplifier; a second amplifier; and a controller, wherein in the balanced mode, an audio signal is amplified by the first amplifier, a negative-phase signal of the audio signal is amplified by the second amplifier, and the amplified audio signal and the amplified negative-phase signal are mixed so as to be output, in the active control ground mode, the audio signal is amplified by the first amplifier, ground is maintained by the second amplifier, and the controller decreases volume of the audio signal that is output in the balanced mode compared with volume of the audio signal that is output in the active control ground mode.

In the present invention, a controller decreases volume of an audio signal that is output in a balanced mode compared with volume of the audio signal that is output in an active control ground mode. Volume of the audio signal that is output in the balanced mode is twice of volume of the audio signal that is output in the active control ground mode. Volume of the audio signal that is output in the balanced mode is decreased compared with volume of the audio signal that is output in the active control ground mode. For this reason, it is easy for a user to judge difference of sound quality of the audio signal that is output in the balanced mode and sound quality of the audio signal that is output in the active control ground mode.

Preferably, wherein the controller decreases volume of the audio signal that is output in the balanced mode compared with volume of the audio signal that is output in the active control ground mode with 6 dB.

Twice volume ratio corresponds to 6 dB sound pressure. For this reason, in the present invention, the controller decreases volume of the audio signal that is output in the balanced mode compared with volume of the audio signal that is output in the active control ground mode with 6 dB. Therefore, volume of the audio signal that is output in the balanced mode and volume of the audio signal that is output in the active control ground mode are equal each other. Thus, it is easier for the user to judge difference of sound quality of the audio signal that is output in the balanced mode and sound quality of the audio signal that is output in the active control ground mode.

Preferably, wherein the controller receives selection of the balanced mode or the active control ground mode, and the controller informs that volume is automatically adjusted in case that it switches from one mode to the other mode.

In the present invention, in case that the controller switches from one mode to the other mode, it informs that volume is automatically adjusted. Thus, the user can understand that volume is automatically adjusted.

Preferably, further comprising a display section, wherein the controller informs that volume is automatically adjusted by displaying a message that volume is automatically adjusted in the display section in case that it switches from one mode to the other mode.

In the present invention, in case that the controller switches from one mode to the other mode, it informs that volume is automatically adjusted by displaying a message that volume is automatically adjusted in a display section. Thus, the user can understand that volume is automatically adjusted.

Preferably, wherein the controller receives setting whether performing auto volume adjustment that decreases volume of the audio signal that is output in the balanced mode compared with volume of the audio signal that is output in the active control mode or not, the controller decreases volume of the audio signal that is output in the balanced mode compared with volume of the audio signal that is output in the active control ground in case that it receives setting performing the auto volume adjustment, and the controller does not change volume of the audio signal that is output in the balanced mode and the active control ground mode in case that it receives setting not performing the auto volume adjustment.

In the present invention, the controller receives setting whether performing auto volume adjustment that decreases volume of the audio signal that is output in the balanced mode compared with volume of audio signal that is output in the active control ground mode or not. Thus, the user can select whether performing the auto volume adjustment or not.

According to the present invention, it is easy for a user to judge difference of sound quality of the audio signal that is output in the balanced mode and sound quality of the audio signal that is output in the active control ground mode.

DETAILED DESCRIPTION OF THE PREFERRED EMBODIMENTS

Figure 1:
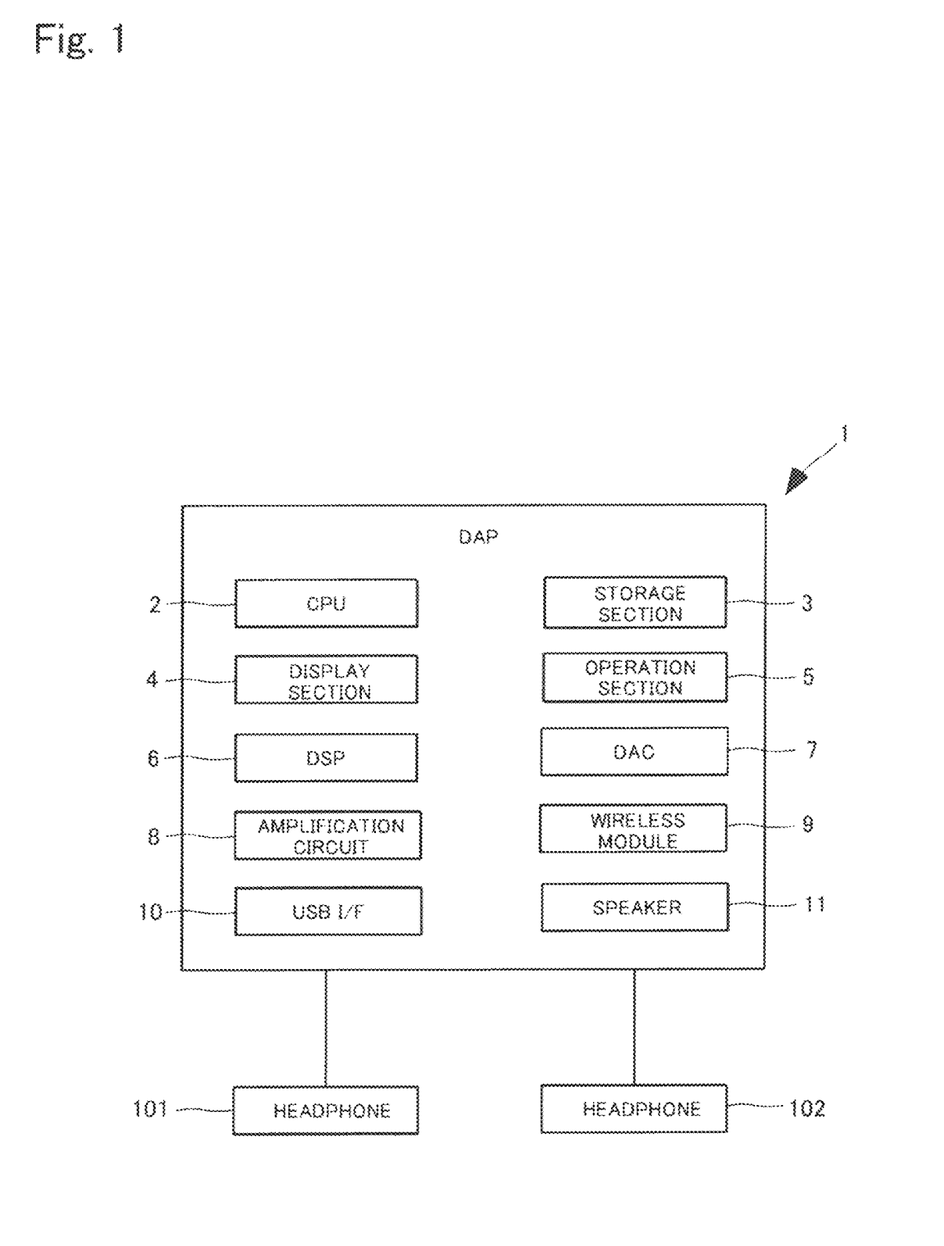
FIG. 1 is a block diagram illustrating a constitution of a digital audio player according to an embodiment of the present invention.

An embodiment of the present invention is described below. FIG. 1 is a block diagram illustrating a constitution of a digital audio player (hereinafter, referred as to "DAP") according to an embodiment of the present invention. A DAP 1 (music reproducing device) outputs an analog audio data (audio signal) to a headphone 101. The headphone 101 outputs an audio to external based on the analog audio data. As illustrated in FIG. 1, the DAP 1 includes a CPU 2, a storage section 3, a display section 4, an operation section 5, a DSP 6, a D/A converter (hereinafter, referred as to "DAC") 7, amplifiers 8 and 9, a wireless module 10, and a USB interface (hereinafter, referred as to "USB I/F") 11.

The CPU (Central Processing Unit) 2 (controller) controls respective sections composing the DAP 1 according to a control program, an OS program or application programs. The storage section 3 is composed of a RAM (Random Access Memory) that functions as a main memory of the CPU 2, a ROM (Read Only Memory) for storing the control program and a flash memory for storing programs such as the OS program and the application programs, and various data such as a digital audio data. The storage section 3 is not limited to the illustrated constitution, and may include an HDD (Hard Disk Drive).

The display section 4 displays various images (including still images and moving images), and is composed of a liquid crystal panel. The operation section 5 has operation keys for performing various settings, and a touch panel that is linked with the display section 4. A user can input various characters and perform setting via the operation section 5.

The DSP (Digital Signal Processor) 6 performs signal processing such as equalizing to the digital audio data. The DAC 7 D/A-converts the digital audio data into the analog audio data. Each of the amplifiers 8 and 9 amplifies the analog audio data that the DAC 7 D/A converts and outputs the amplified analog audio data to the headphone 101. The wireless module 10 is for performing wireless communication according to Bluetooth (registered trademark) standard and Wi-Fi standard. The USB I/F 11 is for performing communication according to USB standard.

The DAP 1 has a balanced mode and an active control ground mode (hereinafter, referred as to "ACG" mode). The balanced mode and the ACG mode are the same as conventional technique described in FIG. 11 and FIG. 12. In case of the balanced mode, the amplifier 8 (first amplifier) amplifies the analog audio data. Further, the amplifier 9 (second amplifier) amplifies a negative-phase analog audio data (negative-phase signal) that the analog audio data is inverted. The amplified analog audio data and the amplified negative-phase analog audio data are mixed so as to be output. In case of the ACG mode, the amplifier 8 amplifies the analog audio data. The amplifier 9 maintains ground.

Figure 2:
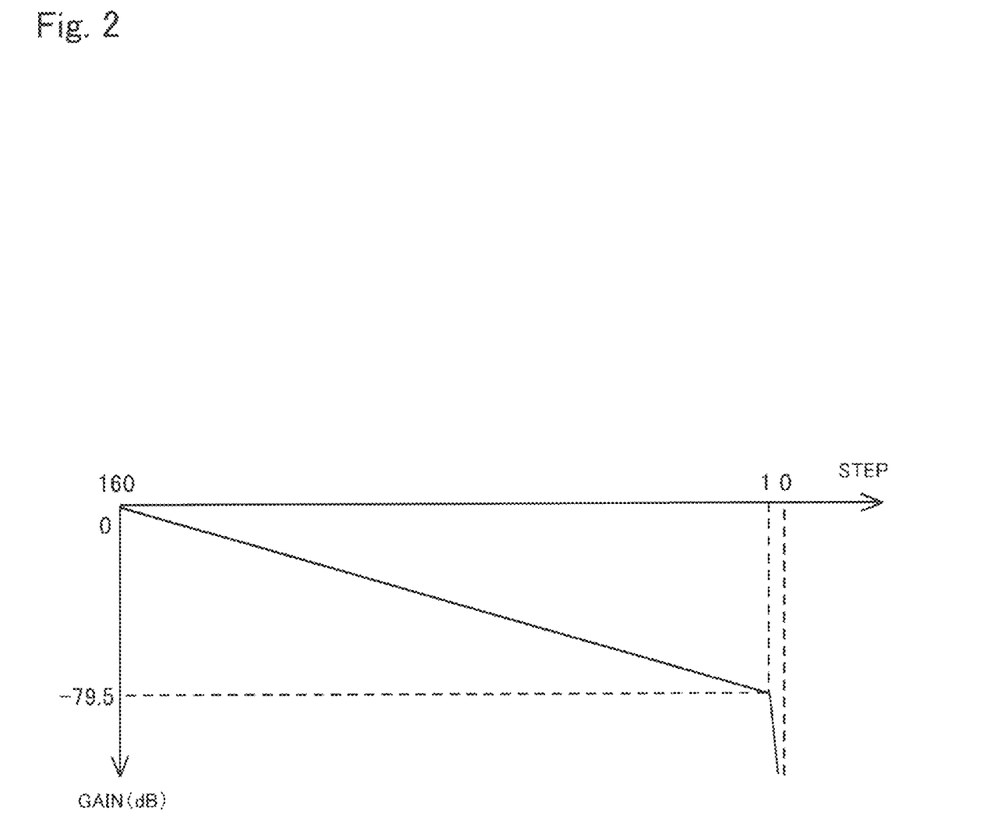
FIG. 2 is a diagram illustrating volume adjustment process in the digital audio player.

FIG. 2 is a diagram illustrating volume adjustment process in the DAP 1. Volume step of the DAP 1 is 160 steps from 0 to 160. In FIG. 2, a horizontal axis illustrates number of step. A vertical axis illustrates gain (dB). Step 160 is 0 dB. Attenuation of volume per one step dropping is 0.5 dB. Step 1 is −79.5 dB. Step 0 is minus infinity, namely, mute state.

The CPU 2 receives setting whether performing auto volume (auto volume control) that decreases volume of the analog audio data that is output in the balanced mode compared with volume of the analog audio data that is output in the ACG mode or not. In case that the CPU 2 receives setting performing auto volume, it decreases volume of the analog audio data that is output in the balanced mode compared with volume of the analog audio data that is output in the ACG mode. Concretely, the CPU 2 reduces volume of the analog audio data that is output in the balanced mode compared with volume of the analog audio data that is output in the ACG mode with 6 dB (−6 dB).

Figure 3:
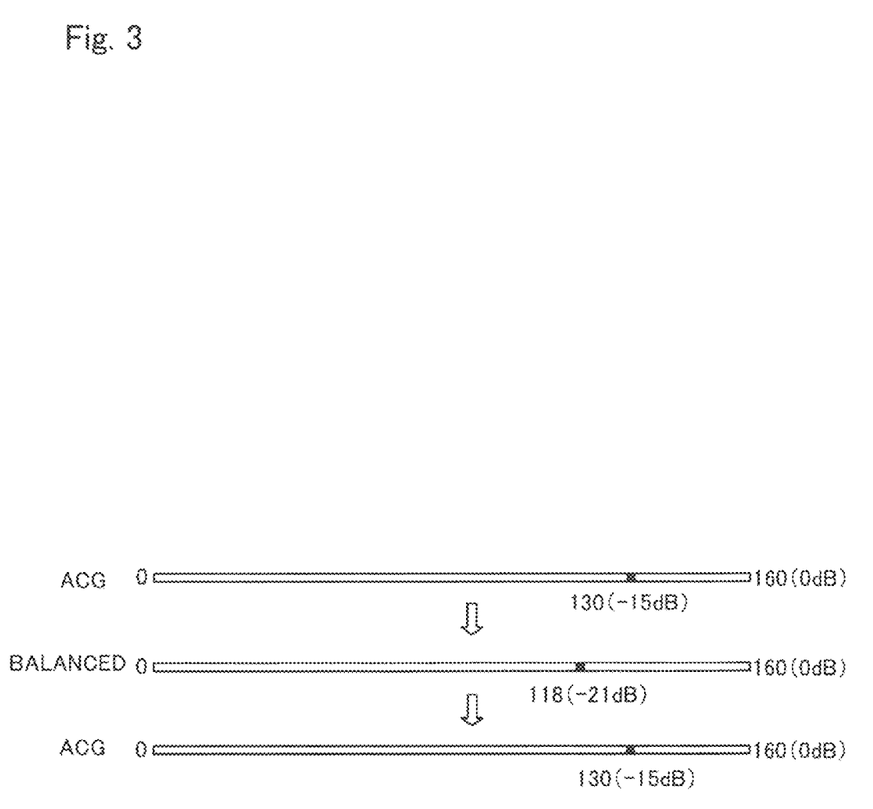
FIG. 3 is a diagram for describing volume adjustment in the digital audio player.

Further, the CPU 2 receives selection of the balanced mode or the ACG mode. In case that the CPU 2 receives switch from the ACG mode to the balanced mode, it reduces volume with 6 dB. As illustrated in FIG. 3, in the ACG mode, it is assumed that volume is −15 dB (step 130). If the CPU 2 switches from the ACG mode to the balanced mode, it decreases volume with 6 dB so as to set volume to −21 dB (step 118). Further, if the CPU 2 switches from the balanced mode to the ACG mode, it increases volume with 6 dB so as to set volume to −15 dB (step 130). Namely, the CPU 2 returns volume to previous volume that is switched to the balanced mode.

Figure 4:
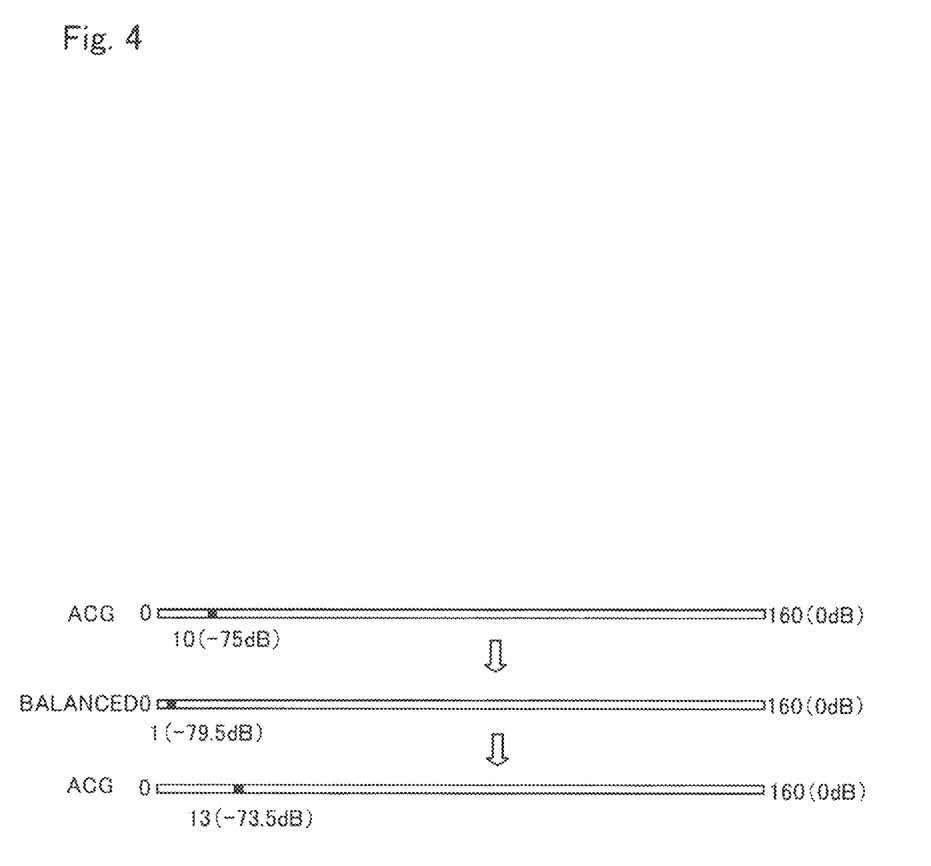
FIG. 4 is a diagram for describing volume adjustment in the digital audio player.

As illustrated in FIG. 4, in the ACG mode, it is assumed that volume is −75 dB (step 10). In case that the CPU 2 switches from the ACG mode to the balanced mode, it decreases volume with 6 dB and volume exceeds −80 dB. For this reason, in case that the CPU 2 switches from the ACG mode to the balanced mode, it decreases volume with 4.5 dB so as to set volume to −79.5 dB (step 1). Further, when the CPU 2 switches from the balanced mode to the ACG mode, it increases volume with 6 dB so as to set volume to −73.5 dB (step 13).

Figure 5:
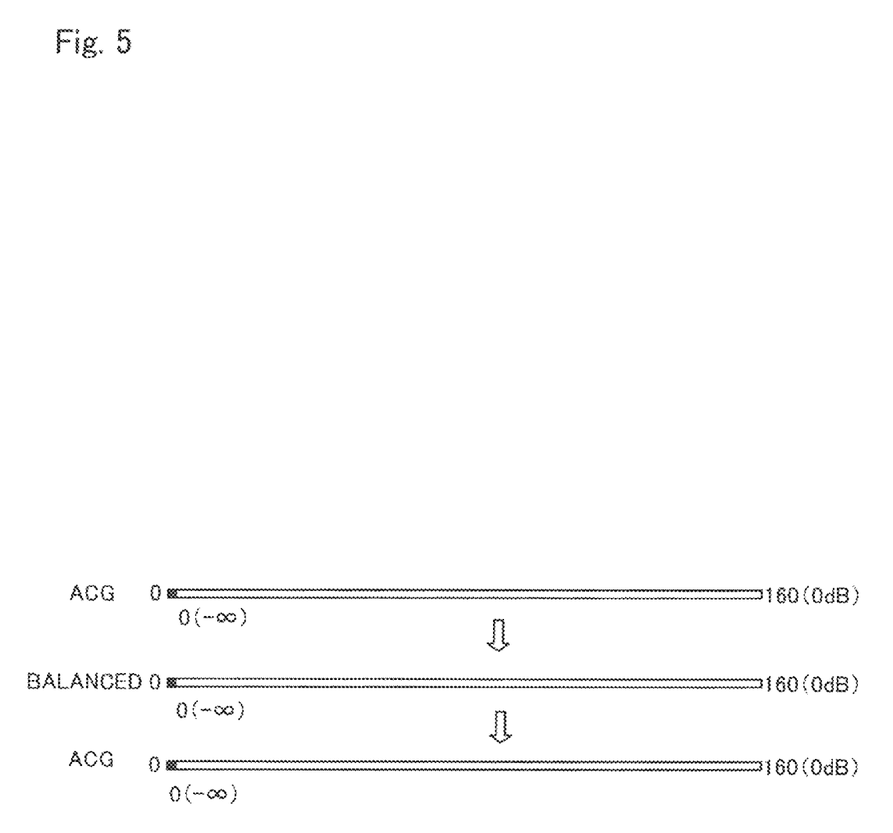
FIG. 5 is a diagram for describing volume adjustment in the digital audio player.

Further, as illustrated in FIG. 5, in the ACG mode, it is assumed that volume is mute (step 0). In case that the CPU 2 switches from the ACG mode to the balanced mode, it does not change volume so as to set volume to mute. In case that the CPU 2 switches from the balanced mode to the ACG mode, it does not change volume so as to set volume to mute.

Figure 6:
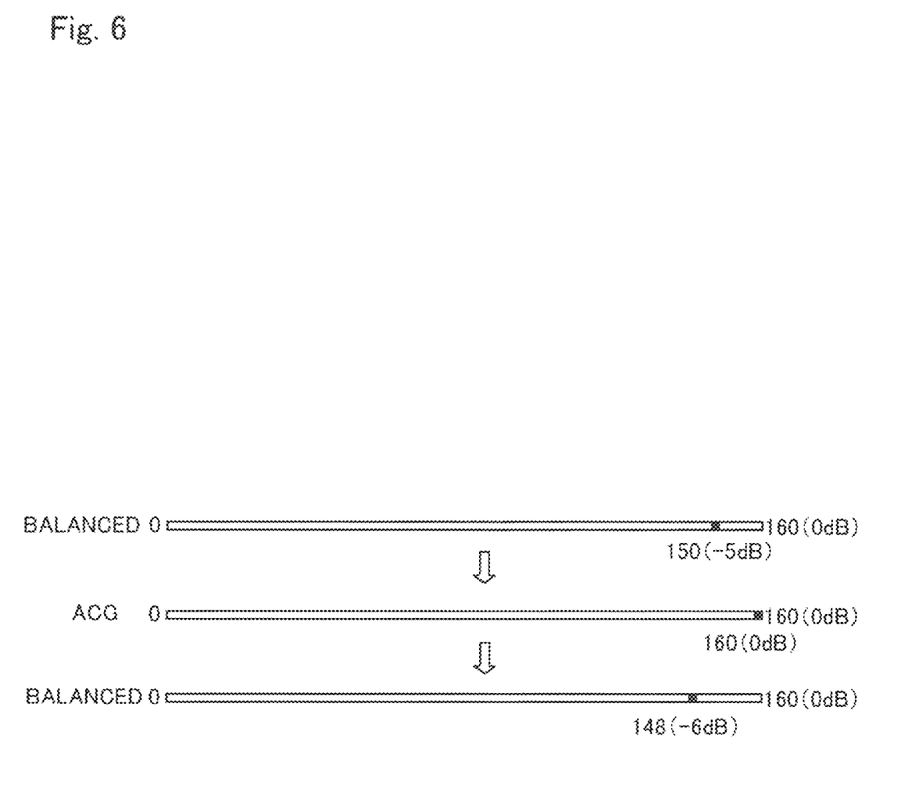
FIG. 6 is a diagram for describing volume adjustment in the digital audio player.

Further, as illustrated in FIG. 6, in the balanced mode, it is assumed that volume is −5 dB (step 150). In case that the CPU 2 switches from the balanced mode to the ACG mode, it increases volume with 6 dB and volume exceeds 0 dB. For this reason, in case that the CPU 2 switches from the balanced mode to the ACG mode, it increase volume with 5 dB so as to set volume to 0 dB (step 160). Further, in case that the CPU 2 switches from the ACG mode to the balanced mode, it decreases volume with 6 dB so as to set volume to −6 dB (step 148).

In case that the CPU 2 receives setting not performing auto volume, it does not change volume of the analog audio data that is output in the balanced mode and the ACG mode.

Figure 7:
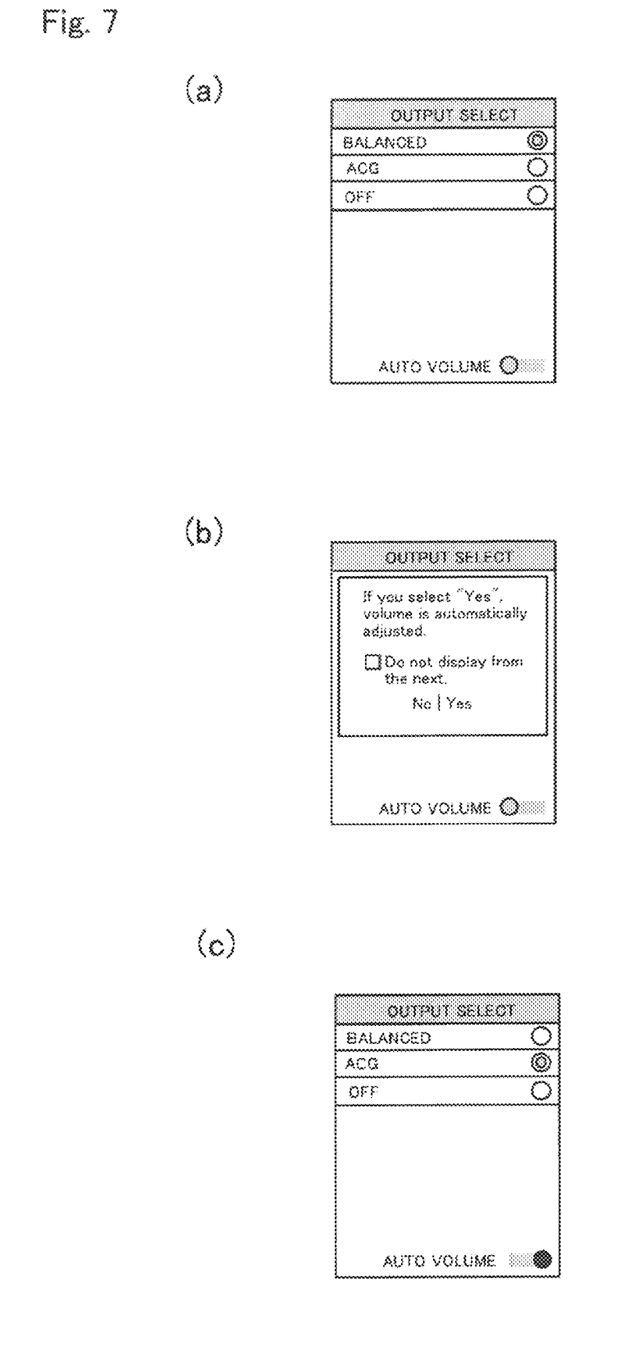
FIG. 7 is a diagram illustrating one example of a display screen for receiving selection of a balanced mode or an ACG mode.

FIG. 7 is a diagram illustrating a display screen for receiving selection of the balanced mode or the ACG mode. In FIG. 7 (*a*), a radio button of the balanced mode is checked and it is displayed that a current mode is the balanced mode. Further, it is displayed that auto volume is OFF state. A user can select the ACG mode by selecting a radio button of the ACG mode. When the radio button of the ACG mode is selected, the CPU 2 receives selection of the ACG mode and displays a display screen for receiving setting whether performing auto volume or not. As illustrated in FIG. 7 (*b*), the CPU 2 displays the display screen including a message of "if you select "Yes", volume is automatically adjusted", "Yes" button, and "No" button in the display section 4. When "Yes" button is selected, the CPU 2 receives setting performing auto volume. As illustrated in FIG. 7 (*c*), the CPU 2 changes the display screen to display that auto volume is ON. Further, the CPU 2 changes the display screen to display that the radio button of the ACG mode is checked.

Figure 8:
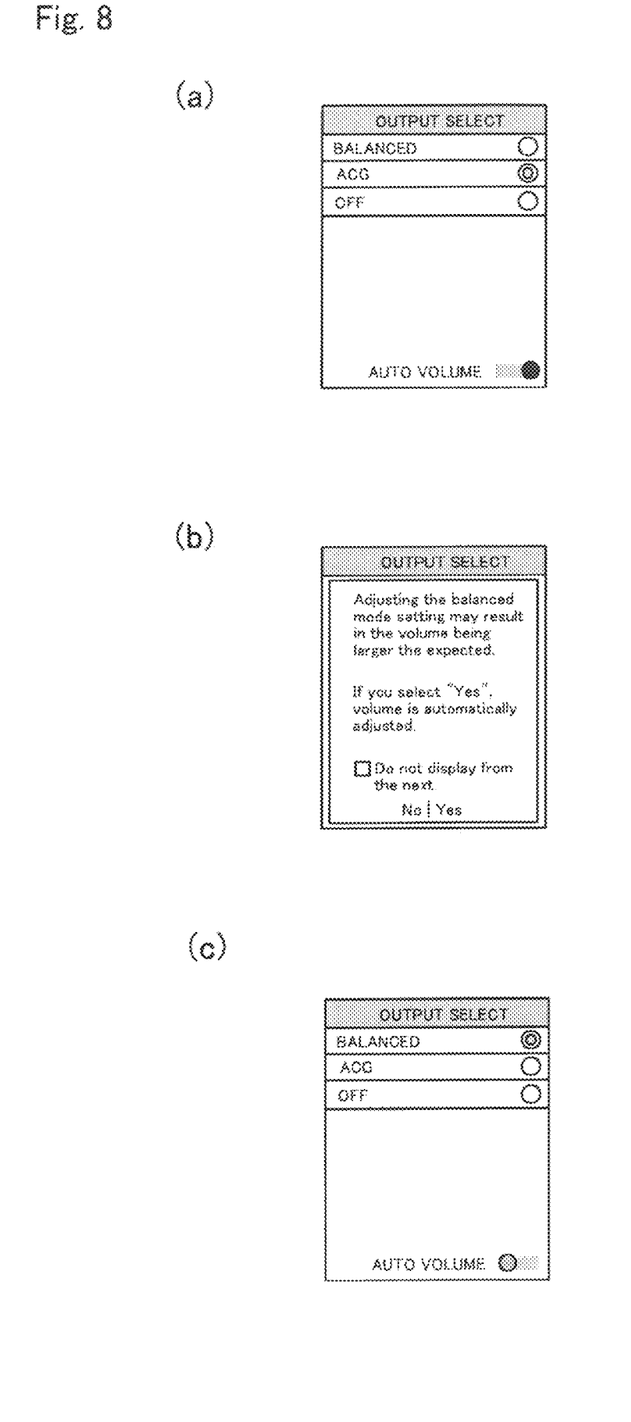
FIG. 8 is a diagram illustrating one example of the display screen for receiving selection of the balanced mode or the ACG mode.

In FIG. 8 (*a*), the radio button of the ACG mode is checked, and it is displayed that the current mode is the ACG mode. Further, it is displayed that auto volume is ON state. The user can select the balanced mode by selecting the radio button of the balanced mode. When the radio button of the balanced mode is selected, the CPU 2 receives selection of the balanced mode and displays the display screen for receiving setting whether performing auto volume or not. As illustrated in FIG. 8 (*b*), the CPU 2 displays the display screen including a message of "if you select "Yes", volume is automatically adjusted.", "Yes" button, and "No" button. When "No" button is selected, the CPU 2 receives setting not performing auto volume. As illustrated in FIG. 8 (*c*), the CPU 2 changes the display screen to display that auto volume is OFF. Further, the CPU 2 changes the display screen to display that the radio button of the balanced mode is checked.

Figure 9:
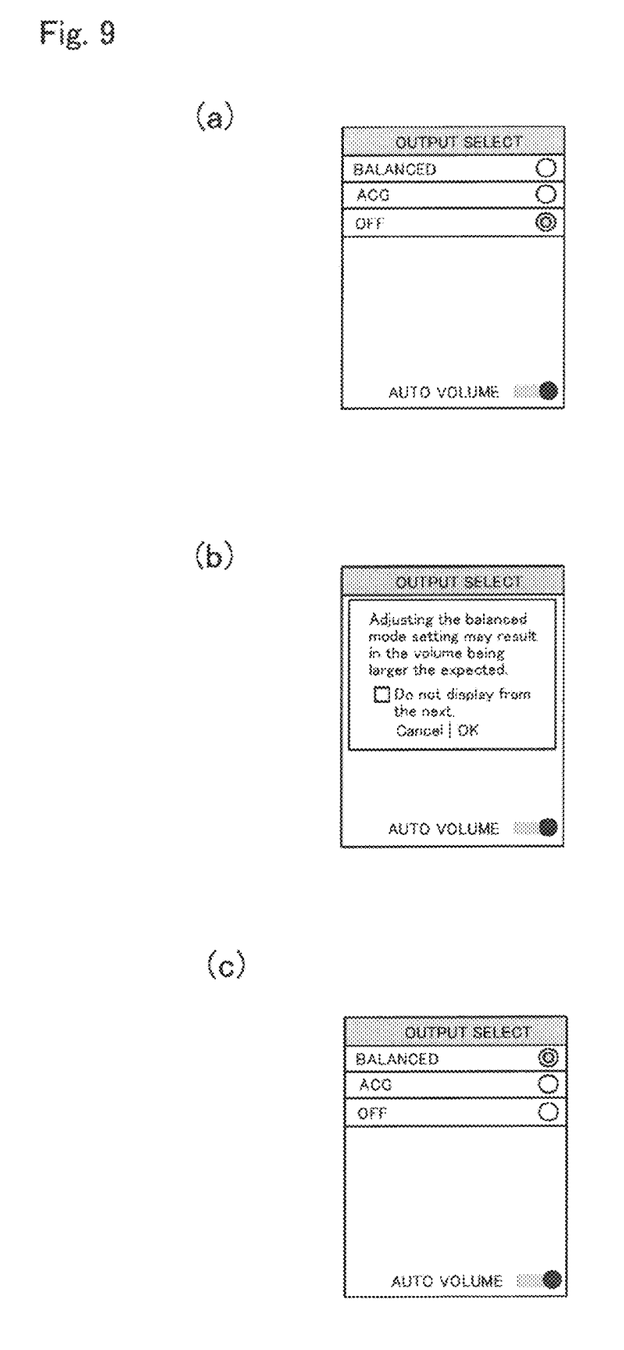
FIG. 9 is a diagram illustrating one example of the display screen for receiving selection of the balanced mode or the ACG mode.

In the DAP 1, the balanced mode and the ACG mode can be OFF. In FIG. 9 (*a*), a radio button of OFF is checked and it is displayed that the balanced mode and the ACG mode are OFF. It is displayed that auto volume is ON. The user can select the balanced mode by selecting the radio button of the balanced mode. When the radio button of the balanced mode is selected, the CPU 2 displays the display screen for receiving selection of the balanced mode. As illustrated in FIG. 9 (*b*), the CPU 2 displays the display screen including a message of "In the balanced mode, volume may be larger than expected.", "Cancel" button, and "OK" button. When "OK" button is selected, the CPU 2 receives selection of the balanced mode. As illustrated in FIG. 8 (*c*), the CPU 2 changes the display screen to display that the radio button of the balanced mode is checked.

Figure 10:
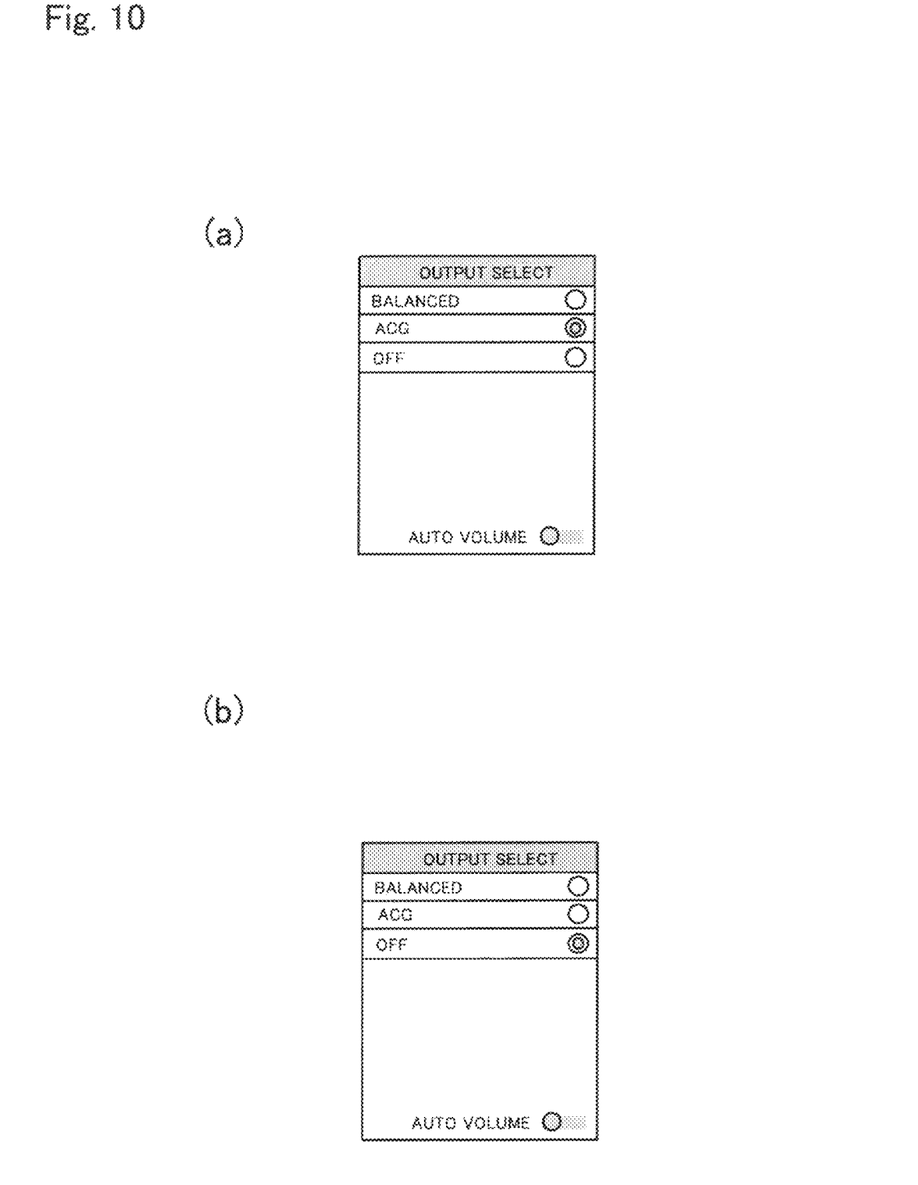
FIG. 10 is a diagram illustrating one example of the display screen for receiving selection of the balanced mode or the ACG mode.

In FIG. 10 (*a*), the radio button of the ACG mode is checked, and it is displayed that the current mode is ACG mode. Further, it is displayed that auto volume is OFF. The user can select OFF of the balanced mode and the ACG mode by the radio button of OFF. The CPU 2 receives the selection of OFF of the balanced mode and the ACG mode. As illustrated in FIG. 10 (*b*), the CPU 2 changes the display screen to display that the radio button of OFF is checked.

As described above, in the present embodiment, the CPU 2 decreases volume of the analog audio data that is output in the balanced mode compared with volume of the analog audio data that is output in the ACG mode. Volume of the analog audio data that is output in the balanced mode is twice of volume of the analog audio data that is output in the ACG mode. Volume of the analog audio data that is output in the balanced mode is decreased compared with volume of analog audio data that is output in the ACG mode. For this reason, it is easy for the user to judge difference of sound quality of the analog audio data that is output in the balanced mode and sound quality of the analog audio data that is output in the ACG mode.

Herein, twice volume ratio corresponds to 6 dB attenuation. For this reason, in the present embodiment, the CPU 2 decreases volume of the analog audio data that is output in the balanced mode compared with volume of the analog audio data that is output in the ACG mode with 6 dB. Therefore, volume of the analog audio data that is output in the balanced mode and volume of the analog audio data that is output in the ACG mode are equal each other. Thus, it is easier for the user to judge difference of sound quality of the analog audio data that is output in the balanced mode and sound quality of the analog audio data that is output in the ACG mode.

Further, in the present embodiment, as illustrated in FIG. 7 (*b*) and FIG. 8 (*b*), in case that the CPU 2 switches from one mode to the other mode, it informs that volume is automatically adjusted by displaying a message that volume is automatically adjusted in the display section 4. Thus, the user can understand that volume is automatically adjusted.

Further, in the present embodiment, the CPU 2 receives setting whether performing auto volume that decreases volume of the analog audio data that is output in the balanced mode compared with volume of the analog audio data that is output in the ACG mode or not. Thus, the user can select whether performing auto volume or not.

The embodiment of the present invention is described above, but the mode to which the present invention is applicable is not limited to the above embodiment and can be suitably varied without departing from the scope of the present invention.

In the above embodiment, in case that the CPU 2 switches from one mode to the other mode, it informs that volume is automatically adjusted by displaying a message that volume is automatically adjusted in the display section 4. Not limited to this, the CPU 2 informs that volume is automatically adjusted by voice.

The above embodiment describes the DAP as a music reproducing device. Not limited to this, the music reproducing device may be a smartphone, a tablet PC, a USB DAC.

The present invention can be suitably employed in a music reproducing device that outputs an audio signal to a headphone.

What is claimed is:

1. A music reproducing device having a balanced mode and an active control ground mode comprising:
    a first amplifier;
    a second amplifier; and
    a controller, wherein
    in the balanced mode, an audio signal is amplified by the first amplifier, a negative-phase signal of the audio signal is amplified by the second amplifier, and the amplified audio signal and the amplified negative-phase signal are mixed so as to be output,
    in the active control ground mode, the audio signal is amplified by the first amplifier, ground is maintained by the second amplifier, and
    the controller decreases volume of the audio signal that is output in the balanced mode compared with volume of the audio signal that is output in the active control ground mode.

2. The music reproducing device according to claim 1, wherein the controller decreases volume of the audio signal that is output in the balanced mode compared with volume of the audio signal that is output in the active control ground mode with 6 dB.

3. The music reproducing device according to claim 1, wherein the controller receives selection of the balanced mode or the active control ground mode, and
    the controller informs that volume is automatically adjusted in case that it switches from one mode to the other mode.

4. The music reproducing device according to claim 3 further comprising a display section,
    wherein the controller informs that volume is automatically adjusted by displaying a message that volume is automatically adjusted in the display section in case that it switches from one mode to the other mode.

5. The music reproducing device according to claim 1, wherein the controller receives setting whether performing auto volume adjustment that decreases volume of the audio signal that is output in the balanced mode compared with volume of the audio signal that is output in the active control mode or not,
    the controller decreases volume of the audio signal that is output in the balanced mode compared with volume of the audio signal that is output in the active control ground in case that it receives setting performing the auto volume adjustment, and
    the controller does not change volume of the audio signal that is output in the balanced mode and the active control ground mode in case that it receives setting not performing the auto volume adjustment.

* * * * *